United States Patent [19]
Yamashita

[11] Patent Number: 6,122,487
[45] Date of Patent: Sep. 19, 2000

[54] COMMUNICATION UNIT

[75] Inventor: Osamu Yamashita, Tokyo, Japan

[73] Assignee: NEC Corporation, Tokyo, Japan

[21] Appl. No.: 08/961,768

[22] Filed: Oct. 31, 1997

[30] Foreign Application Priority Data

Oct. 31, 1996 [JP] Japan ................................. 8-290059

[51] Int. Cl.⁷ ............................... H04B 1/16; H04B 1/44
[52] U.S. Cl. ............................................ 455/78; 370/347
[58] Field of Search .................................. 455/78, 82, 83; 333/100, 101; 370/321, 337, 347, 442

[56] References Cited

U.S. PATENT DOCUMENTS

| | | | |
|---|---|---|---|
| 5,477,532 | 12/1995 | Hoshigami | 455/82 |
| 5,553,317 | 9/1996 | Hara | 455/83 |
| 5,629,960 | 5/1997 | Dutkiewicz | 455/78 |
| 5,768,691 | 6/1998 | Matero | 455/78 |
| 5,867,777 | 2/1999 | Yamaji | 455/240 |
| 5,881,371 | 3/1999 | Reynolds | 455/83 |

FOREIGN PATENT DOCUMENTS 6-268553  9/1994  Japan .

*Primary Examiner*—Daniel S. Hunter
*Assistant Examiner*—Nick Corsaro
*Attorney, Agent, or Firm*—Sughrue, Mion, Zinn, Macpeak & Seas, PLLC

[57] ABSTRACT

When a DC offset is detected, connection between a switch circuit and antenna is shut off by means of a switch circuit. The DC offset component generated in the orthogonal detector output during shutting off is stored, and is subtracted from the demodulator output generated when the reception signal is inputted for correction.

10 Claims, 3 Drawing Sheets

COMMUNICATION UNIT

BACKGROUND OF THE INVENTION

1. Field of the Invention

This invention relates to a communication unit, and particularly relates to a communication unit having an orthogonal demodulation circuit.

2. Description of the Related Art

Operation of a conventional communication unit having an orthogonal demodulation circuit is described with reference to FIG. 1.

A signal received by the antenna 101 is amplified by the reception amplifier 103, and subjected to orthogonal detection by an orthogonal detector 110. The orthogonal detector 110 comprises multipliers 106 and 107 and oscillator 109, then a signal from the reception amplifier 103 is inputted to the one input terminals of the respective multipliers 106 and 107. A local signal that is the output from the oscillator 109 is inputted to the other input terminal of the multiplier 106, and the signal having the phase shifted 90 degrees is inputted to the other terminal of the multiplier 107. The outputs from the multipliers 106 and 107 are inputted respectively to the amplifiers 111 and 112, and also to an error detection circuit 203. The outputs from the amplifiers 111 and 112 are demodulated by the demodulation circuit 202.

On the other hand, a signal outputted from the modulation circuit 119 is subjected to orthogonal modulation using the local signal outputted from the oscillator 118 in an orthogonal modulator 117, and sent out from the antenna 101 through a transmission amplifier 116 and switch circuit 201.

The output of the transmission amplifier 116 is inputted to the reception amplifier 103 through an attenuator 201a in the switch circuit 201 as a local loop back signal. The local loop back signal is subjected to orthogonal detection in the orthogonal detection circuit 110 and inputted to the error detection circuit 203 like the reception signal from the antenna 101.

In a communication unit having such structure, when a power is on, a direct current offset error and gain error of the reception signal and local loop back signal are detected by an error detector 203, and fed back to the reception amplifier 103 and transmission amplifier 116.

A communication unit provided with automatic adjusting function of the sort is disclosed, for example, in Japanese Patent Laid-Open No. Hei 6-268553.

However, the above-mentioned communication unit requires a circuit exclusively used for correction of DC offset component of the reception signal, the requirement results in a large circuit scale because the conventional communication unit monitors the output signal outputted from the orthogonal detector and feeds back the error information to the amplifier on a hardware basis.

It is difficult to detect a DC offset component of the same channel just before the reception timing in time-division multi access (TDMA) because the detection output of the reception signal is used for DC offset detection, and therefore DC offset correction in reception channel during calling is difficult.

SUMMARY OF THE INVENTION

It is the object of the present invention to provide a communication unit which corrects the DC offset component of a reception signal by way of digital signal processing using DSP.

It is the other object of the present invention to provide a communication unit which is capable of detecting a DC offset component of the same channel just before the reception timing in TDMA.

In a communication unit of the present invention, the signal path from an antenna to a receiver is shut off using a switch just before the reception timing of TDMA system, and DC offset detection is performed at the time point. More preferably, a signal path is shut off using a switch circuit between an antenna and a reception amplifier at the timing just before a reception time slot. At this time, the DC offset component included in the orthogonal detector output is stored in a decoder. When receiving, the received demodulation component is compared with the stored DC offset component.

The DC offset component generated in a receiver is detected just before the reception timing as a digital signal, and by correcting it using the offset signal stored in the subsequent received demodulation signal, DC offset of the receiver is performed.

BRIEF DESCRIPTION OF THE DRAWINGS

These and other objects, features and advantages of this invention will become more fully apparent from the following detailed description taken with the accompanying drawings in which.

In the drawings, the same reference numerals denote the same structural elements.

DETAILED DESCRIPTION OF THE PREFERRED EMBODIMENTS

Next, an example of the present invention will be described in detail hereinafter with reference to the drawings.

Figure 1:
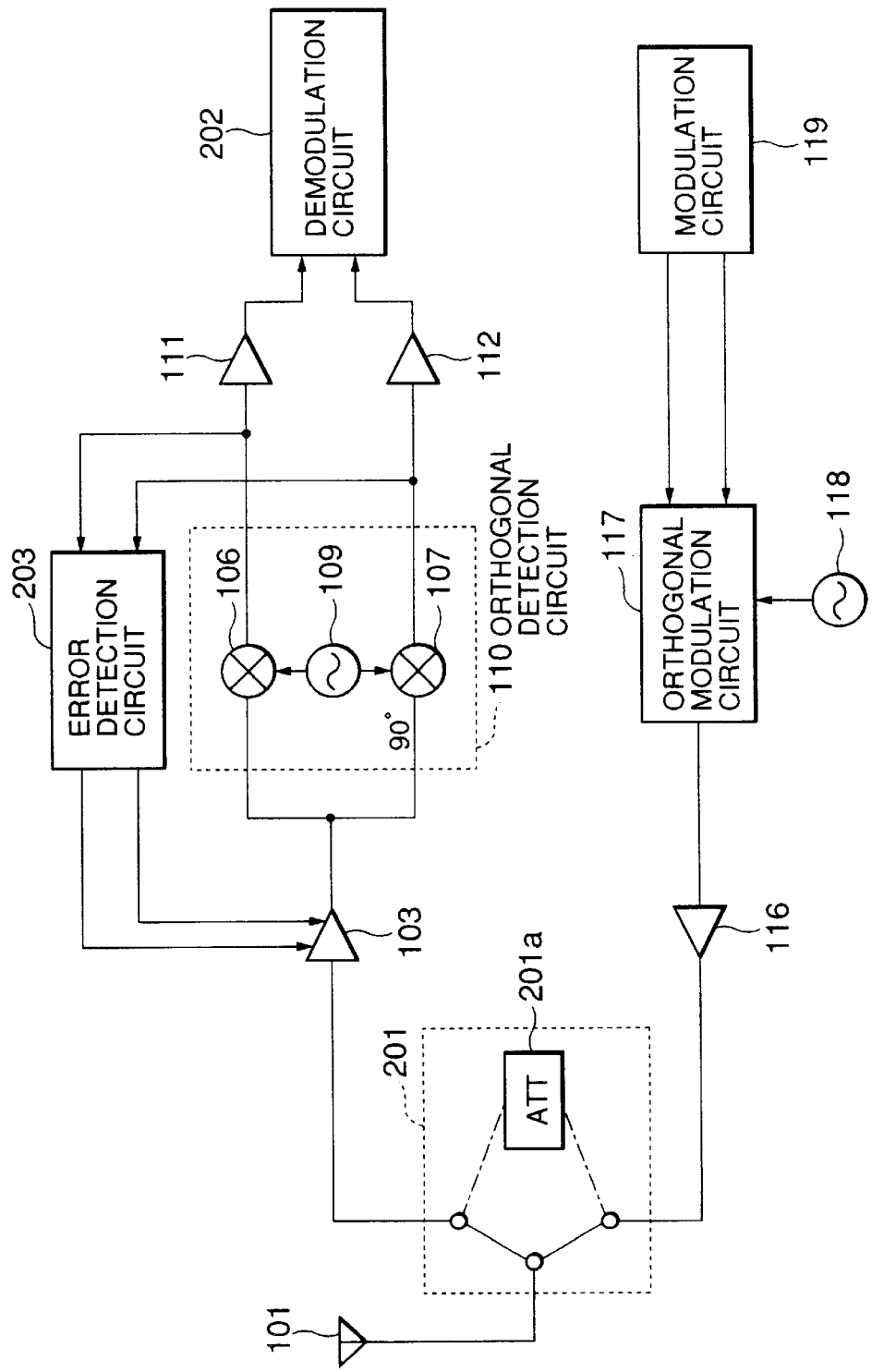
FIG. 1 is a structural block diagram for illustrating a conventional communication unit.
Figure 2:
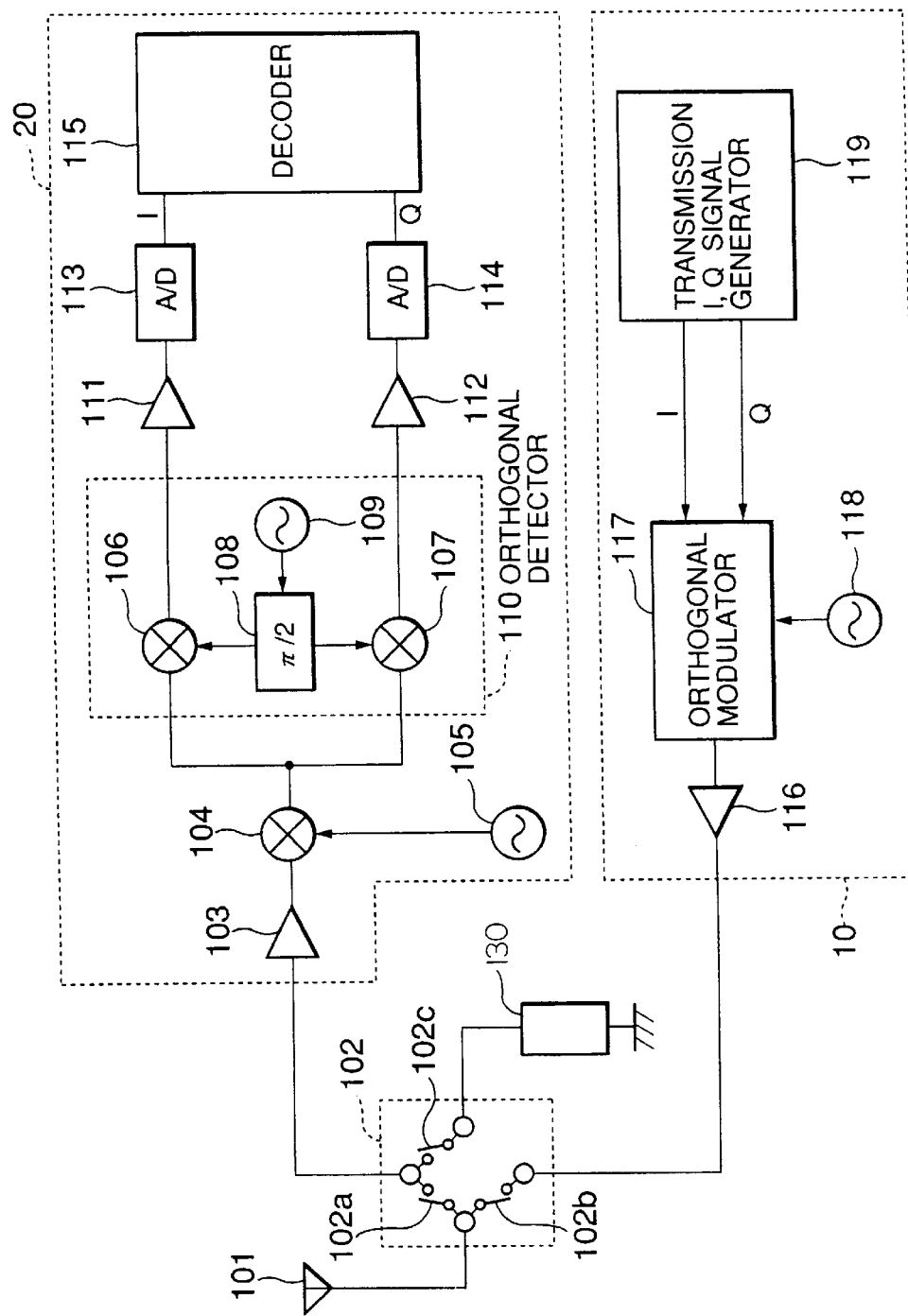
FIG. 2 is a structural block diagram for illustrating an example of the present invention.

In FIG. 2, a communication unit of the present invention has a transmitter 10, receiver 20, transmission/reception antenna 101, and switch circuit 102.

In the transmitter 10, a transmission I, Q signal generator 119 outputs an orthogonal modulation wave to an orthogonal modulator 117. The orthogonal modulator 117 performs orthogonal modulation on the orthogonal modulation wave I, Q using a frequency of an oscillator 118, and outputs the orthogonal modulated transmission signal to a transmission power amplifier 116. The orthogonal modulated transmission signal amplified by the transmission power amplifier 116 is sent out from the antenna 101 through a switch 102b of a switch circuit 102.

On the other hand, a reception signal from the antenna is inputted to a reception amplifier 103 through the switch 102a of the switch circuit 102. The reception amplifier 103 outputs the amplified reception signal to a mixer 104. The mixer 104 converts it to an IF signal using a local signal from an oscillator 105 and outputs it to an orthogonal detector 110. The orthogonal detector 110 orthogonally detects the IF signal, and outputs SIN wave and COSIN wave. The SIN wave and COSIN wave are amplified respectively by I, Q signals amplifiers 111 and 112, and converted to I, Q signals by A/D converters 113 and 114. A decoder 115 decodes the I, Q digital signals and outputs a decoded signal.

The orthogonal detector 110 comprises multipliers 106 and 107, π/2 phase shifter 108, and oscillator 109. The multiplier 106 multiplies the IF signal by the signal from the oscillator 109 to generate the SIN wave. The multiplier 107 generates the COSIN wave from the IF signal and the signal that a signal of the oscillator 109 is subjected to π/2 phase shifted by the π/2 phase shifter 108. The π/2 phase shifter 108 may be one-input-two-output type, in this case, the signal from the oscillator 109 is converted to the first and second signals having relatively π/2 phase difference, and the first and second signals are outputted respectively to the multipliers 106 and 107.

The communication unit of the present invention has a load 130 such as resistor, the one end of the load 130 is connected to the receiver 20 through the switch 102c in the switch circuit 102, and the other end is grounded.

In the switch 102, during transmission of an orthogonal modulation transmission signal, the switch 102b is controlled to be ON, and the switches 102a and 102c are controlled to be OFF.

On the other hand, during receiving, the switch 102a is controlled to be ON, and the switches 102b and 102c are controlled to be OFF. Just before a reception signal is received, the switch 102c is controlled to be ON and the switches 102a and 102b are controlled to be OFF. These switches are controlled by a control circuit not shown in the drawing. The control circuit controls various timing of this unit.

As described herein above, the switch 102a is turned ON at the reception timing of the time slot allocated to this unit out of time-division multiplied signals for signal reception, and just before the time slot reception timing, the switch 102c is turned ON, thereby the receiver 20 is grounded through the load 130, and DC offset correction is performed as described hereinafter. On the other hand, transmission is performed while the switches 102a or 102c is not ON.

Usually a guard time is provided between each time slot. Therefore it is preferable to perform DC offset correction in the guard time before the reception time slot.

In the case that there is no guard time, DC offset correction can be performed at the time slot precedent to the time slot which this unit receives. In this case, it should be premised that the preceding time slot is not used for transmission.

In the case of time-division multiplexing communication having guard time, DC offset correction may be performed using the time slot just precedent to the time slot used for reception instead of guard time.

Next, operations of an example of the present invention is described.

During reception of time-division multiplexing signal, to correct the DC offset component generated in the reception amplifier 103, mixer 104, orthogonal detector 110, and I, Q signal amplifiers 111 and 112, the switch 102a of the switch circuit 102 is opened just before the reception timing to shut off signal input from the antenna to the receiver. Simultaneously, the switch 102c is turned ON to connect the input of the reception amplifier 103 to GND through the load 130. In this condition, the digital value of the respective I, Q outputs from the orthogonal detector 110 is stored in the decoder 115. The switch 102a in the switch circuit 102 is turned ON at the subsequent reception timing, and the switch 102c is opened to input the reception signal from the transmission/reception antenna 101 to the reception amplifier 103 of the receiver 20. When the demodulated output of the reception signal is decoded by the decoder 115, the reception signal is corrected using the stored DC offset component.

The structure and operations of the above-mentioned decoder 115 is described in detail with reference to FIG. 3.

Figure 3:
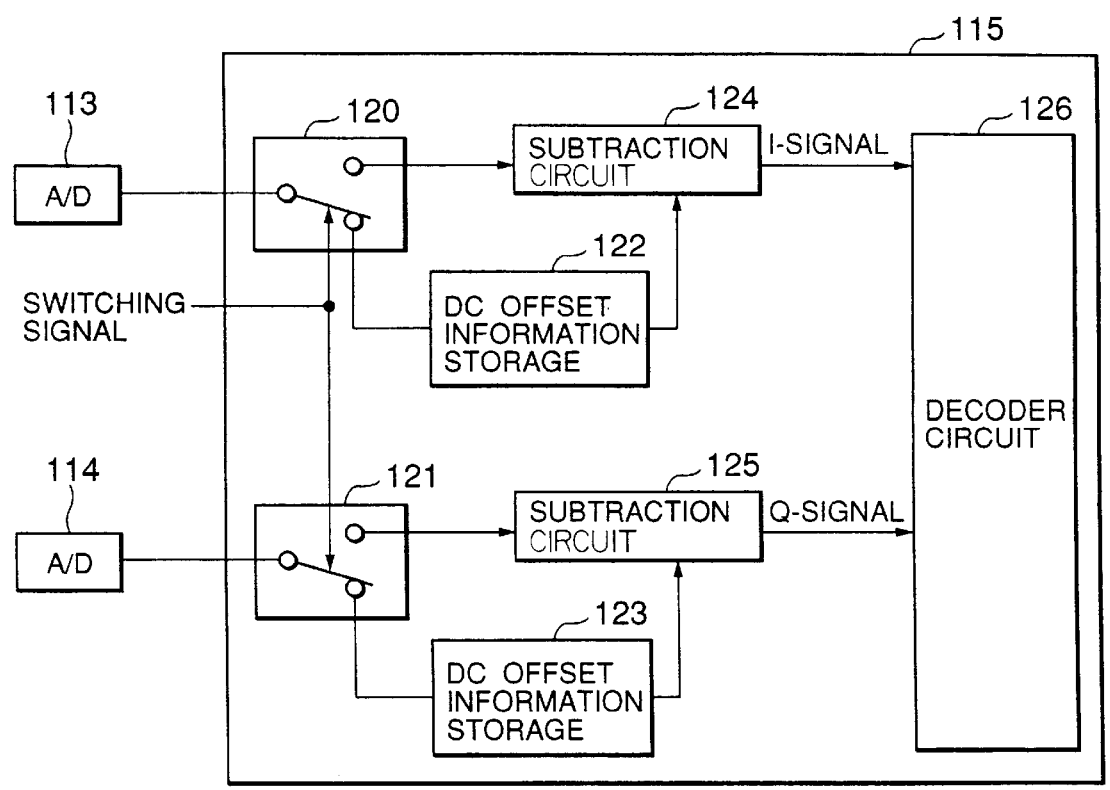
FIG. 3 is a structural block diagram for illustrating a decoder shown in FIG. 2.

In FIG. 3, the decoder 115 comprises a switch circuits 120 and 121, DC offset information storages 122 and 123, subtraction circuits 124 and 125, and decoder section 126.

When the switch 102c is turned ON, the antenna path is shut off, and the receiver 20 is grounded through the load 130, the switch circuits 120 and 121 connect the A/D 113 and A/D 114 respectively to the DC offset information storages 122 and 123 in response to a switching signal. The information storage comprises, for example, a memory or register.

The switching signal operates linking with a switch control of the switch circuit 102.

The DC offset information storages 122 and 123 store the input offset values respectively.

On the other hand, when the switch 102a is turned ON, the antenna path is connected to the receiver, and the signal is received, the A/D 113 and 114 are connected respectively to the subtraction circuits 124 and 125 through the switching circuits 120 and 121 in response to a switching signal. As the result, the subtraction circuits 124 and 125 subtract respectively the offset values stored in the offset information storages 122 and 123 from the signals outputted from A/D 113 and 114 to generate I, Q signals, and the I, Q signals are inputted to the decoder section 126.

As described herein above, a decoded signal having corrected DC offset value is obtained.

In the above-mentioned example, though the case that the present invention is applied to a communication unit has been described, however the present invention is also applied to portable units used for mobile communication, and portable telephones.

As described hereinbefore, DC offset is performed by way of digital processing in the present invention, therefore it is not required to provide a hard feedback circuit to the circuit of the receiver, and the circuit scale is minimized.

Further, DC offset is performed by completely shutting off the input to the receiver by means of a switch, it is not required to input a particular prescribed reception signal, and DC offset is corrected every reception time slot. Thus, more highly accurate reception processing is performed consistently.

While the invention has been described with reference to specific embodiments thereof, it will be appreciated by those skilled in the art that numerous variations, modifications, and embodiments are possible, and accordingly, all such variations, modifications, and embodiments are to be regarded as being with in the spirit and scope of the invention.

What is claimed is:

1. A communication unit, comprising an antenna, receiver, and switching circuit for selectively connecting said receiver and antenna, a reference load selectively connected to said receiver through said switching circuit at a selected timing before receipt of a reception signal from said antenna, said antenna being disconnected from said receiver during said selected timing, said receiver storing a direct current offset component of a reception signal detected during said selected timing.

2. The communication unit as claimed in claim 1, wherein said reference load is a terminal resistor connected to said receiver by means of said switch circuit.

3. The communication unit as claimed in claim 1, wherein said receiver includes an orthogonal detector for performing orthogonal detection on a reception signal from said antenna.

4. The communication unit as claimed in claim 1, further including a digital storage circuit for storing a direct current offset component as a direct current offset component having digital value format, and a subtraction circuit receiving said stored direct current offset component and a reception signal to subtract said stored direct current offset component from said reception signal to perform direct current offset correction.

5. The communication unit as claimed in claim 1, wherein said reception signal is a time-division multiplexed signal containing a plurality of time slots.

6. The communication unit as claimed in claim 5, wherein said selected timing is a timing before the time slot addressed to said communication unit is received.

7. A DC offset correction method in a communication unit, said method comprising:

detecting a DC offset component before receiving a reception signal at a receiver of the communication unit;

storing the detected DC offset component in digital format;

performing detection on the reception signal at the receiver after the DC offset component is stored; and correcting the DC offset component of the detected reception signal based on the stored value of the DC offset component.

8. The method as claimed in claim 7, wherein said method further comprises:

disconnecting the receiver from an antenna that receives reception signals before the DC offset signal is detected; and connecting the receiver to the antenna after the DC offset component is stored.

9. The method as claimed in claim 8, wherein said detection step is performed at a timing before a preselected reception timing for said reception signal at said communication unit.

10. The method as claimed in claim 9, wherein said preselected reception timing is a time slot of a time-division multiplex signal.

\* \* \* \* \*